United States Patent [19]

Tacken

[11] Patent Number: 4,642,668
[45] Date of Patent: Feb. 10, 1987

[54] SEMICONDUCTOR DEVICE HAVING IMPROVED THERMAL CHARACTERISTICS

[75] Inventor: Henricus T. J. Tacken, Nijmegen, Netherlands

[73] Assignee: U.S. Philips Corporation, New York, N.Y.

[21] Appl. No.: 805,579

[22] Filed: Dec. 5, 1985

Related U.S. Application Data

[63] Continuation of Ser. No. 558,228, Dec. 5, 1983, abandoned.

[30] Foreign Application Priority Data

Dec. 17, 1982 [NL] Netherlands ............... 8204878

[51] Int. Cl.$^4$ .................. H01L 29/70; H01L 29/72
[52] U.S. Cl. ........................... 357/36; 357/28; 357/34; 357/40; 357/45
[58] Field of Search ............ 357/34, 36, 28, 40, 357/45

[56] References Cited

U.S. PATENT DOCUMENTS

| | | | |
|---|---|---|---|
| 3,567,506 | 3/1971 | Belardi | 357/36 |
| 3,704,398 | 11/1972 | Fukino | 357/36 |
| 3,868,720 | 2/1975 | New et al. | 357/36 |
| 3,896,486 | 7/1975 | Wright | 357/36 |
| 3,952,258 | 4/1976 | Smulders | 330/289 |
| 4,136,354 | 1/1979 | Dobkin | 357/36 |
| 4,161,740 | 7/1979 | Frey | 357/36 |

FOREIGN PATENT DOCUMENTS 7705729 11/1978 Netherlands ................. 357/36

OTHER PUBLICATIONS

G. Bosch, "Anomalous Current Distributions in Power Transistors", *Solid-State Electronics*, 1977, vol. 20, 635–640.

Primary Examiner—William D. Larkins
Assistant Examiner—Charles S. Small, Jr.
Attorney, Agent, or Firm—Robert T. Mayer; Steven R. Biren

[57] ABSTRACT

The thermal behavior of a semiconductor body is considerably improved by giving parts of high and equal dissipation the same surface area and situating these regions so that the edge of the semiconductor body constitutes a mirror surface for a row of such regions. These regions may comprise subtransistors of power transistors or a Darlington circuit. In the latter case, a further improvement is possible by thermal cross-coupling. The additional space at the edge which is required to apply the reflection principle can be used for nondissipating elements.

7 Claims, 5 Drawing Figures

SEMICONDUCTOR DEVICE HAVING IMPROVED THERMAL CHARACTERISTICS

This is a continuation of application Ser. No. 558,228, filed Dec. 5, 1983, now abandoned.

BACKGROUND OF THE INVENTION

The invention relates to a semiconductor device having a semiconductor body comprising several surface regions provided with semiconductor elements, whereby in the operating condition the surface regions have a comparatively high dissipation with respect to remaining parts of the semiconductor body.

The surface regions having a high dissipation may be, for example, parts of a power transistor, this power transistor being subdivided into a number of subtransistors in order to improve the thermal behavior of the transistor. In such power transistors, the emitter is frequently constituted by a row of finger-shaped regions, which are designated hereinafter as emitter fingers and which extend parallel to each other and in a direction at right angles to the longitudinal direction of the row in a base zone of the transistor.

As is known, in bipolar transistors with larger currents the major part of the emitter current is injected into the base through those parts of the emitter-base junction which are closest to the base contact. Parts of the emitter-base junction which are located more distant from the base contact are not or are substantially not effective due to voltage losses in the base. When the emitter is subdivided, the base contact can be given such a configuration that an emitter-base junction is obtained which has a comparatively large injecting surface area with larger currents. The base contact may then have the form, for example, of a number of base contact fingers which are interdigitated with the emitter fingers.

Power transistors of the kind described above are often provided with resistors in the emitter or base connection in order to avoid so-called "second breakdown". This effect can occur due to a local temperature increase of the emitter-base junction. At the area at which such a temperature increase occurs, even if it is small, the emitter current across the emitter-base junction will increase. This results in a local increase of the dissipation and hence in a further temperature increase. In this manner, an avalanche effect can be obtained, which results in a breakdown which may lead to the destruction of the transistor. When, for example, resistors (connected to the emitter fingers) are included in the emitter path of the transistor, in the case of any local temperature increase and the current increase connected therewith, the forward voltage across the emitter-base junction and hence the emitter current across this emitter-base junction is reduced.

In order to obtain optimum protection against second breakdown for the whole operational working range, within which it should be possible to operate the transistor, comparatively large resistors are required. However, the operating conditions are frequently such that it will be necessary to use considerably lower resistance values, as is the case when the current has to be large and at the same time the voltage drop across the resistor has to be low. In general, it can therefore be said that, when given resistance values are chosen with a view to very special operating conditions of the transistor, an optimum operation of the transistor under other operating conditions is not guaranteed.

It has been found that an important cause of "second breakdown" is the non-uniform temperature distribution obtained in the transistor during operation. It has been found, for example, that without special measures, the temperature of a transistor is lower at the periphery than at the center. As a result, "second breakdown" will generally occur at the center rather than at the periphery of the transistor. In U.S. Pat. No. 3,704,398 it has already been suggested in connection herewith to enlarge the distance between adjacent emitter fingers at the center of the transistor with respect to the distance between adjacent emitter fingers at the periphery of the transistor. By a suitable choice of the distances between the emitter fingers and hence of the thermal resistances between the various emitter fingers, a better temperature distribution in the transistor can be obtained.

Another solution, in which less space is occupied, has been suggested in Dutch Patent Application No. 770,5729, laid open for public inspection on Nov. 28, 1978, corresponding to U.S. Ser. No. 301,870. In this case, a more uniform temperature variation is obtained in a transistor by giving the emitter fingers different lengths so that, due to unequal dissipation in the emitter fingers, the uniformity in the temperature distribution across the transistor is improved in the longitudinal direction (at right angles to the emitter fingers).

As stated above, for high powers a transistor can be subdivided into a number of subtransistors. These subtransistors can then again have a structure with unequal lengths of the emitter fingers, for example, such that the length of the emitter fingers decreases from the periphery of the transistor towards the center. However, experiments have shown that especially with such high-power transistors, whereby the transistor is subdivided into a large number of subtransistors in order to obtain a sufficient current capacity at a low voltage, nevertheless thermal instabilities may occur, which lead to the "second breakdown" effect. Infrared measurements on such semiconductor devices having several dissipating subregions have also shown that the temperature variation across the semiconductor body is not optimal.

A first solution of this problem can be found in that emitter series resistors are used (or already existing emitter series resistors are enlarged). The disadvantages connected with the use of emitter series resistors have been described above.

Another solution can be found in that, when emitter fingers of different lengths are used, a more strongly pronounced difference in length (for example, even shorter fingers at the center) is chosen for those fingers. However, since for the same quantity of current the overall emitter length has to remain the same, this would only result in an even larger number of subtransistors, whereby the temperature variation across the semiconductor body would be deteriorated.

SUMMARY OF THE INVENTION

The present invention has for its object to provide a semiconductor device of the kind mentioned above, in which the problems of "second breakdown" are move fully eliminated than in the known structures.

It is based on the recognition of the fact that this can be achieved by choosing the relative geometry of the dissipating subregions such that a more uniform temperature variation is obtained throughout the semiconductor body.

A semiconductor device according to the invention is characterized in that a number of surface regions having substantially the same dissipation and surface area between two parallel edges of the semiconductor body are located along a line at right angles to these edges beside each other with substantially equal distances between the surface areas, while at the area of the edges the distance of an edge of the semiconductor body from the adjacent surface region is substantially equal to half the distance between two adjacent surface regions.

Dut to the fact that the edges of the semiconductor body effectively constitute mirror surfaces for the dissipated energy, for a clear understanding of the invention the structure can be assumed to be effectively extended to both sides. Thus, a structure is obtained which has surface areas of equal size and dissipation, which are located at uniform relative distances. This leads to a uniform temperature distribution. It should be noted that for a mathematical model of a transistor with ideal thermal behavior, the article "Anomalous current distributions in power transistors", published in Solid State Electronics, 1977, Vol. 20, pp. 635-640, discloses a transistor in which the emitter fingers are spaced apart by equal distances and the outer emitter fingers rare located at half the distance from the edge.

The merit of the invention inter alia consists in that this structure, which only serves to illustrate a theoretical-mathematical model in which only the temperature distribution in a transistor having identical emitter fingers is described, provides a practical solution for a semiconductor device comprising several surface regions of a comparatively high dissipation.

Since moreover there is a general tendency to reduce the surface area of semiconductor crystals, the edge is intentionally chosen here to lie at a comparatively large distance from the edge of the outer dissipating surface region, which results in a large distance between various surface regions. Nevertheless, this measure, which at first sight seems to be disadvantageous (enlargement of the surface area) proves to have advantageous consequences. In fact, it has been found that this measure leads to a very favorable temperature variation across the semiconductor body, which, for example in the case of power transistors, reduces considerably the possibility of "second breakdown". Moreover, the additional surface area can be used in more complicated semiconductor devices for low-dissipating elements.

A preferred embodiment of a semiconductor device according to the invention is characterized in that the surface regions comprise subtransistors of a power transistor having an emitter of a first conductivity type adjoining the surface, a base of the opposite conductivity type likewise adjoining the surface and a collector of the first conductivity type adjoining the base, the emitter being at least mainly constituted by a single row of finger shaped regions (designated hereinafter as emitter fingers) of the first conductivity type, which extend in the base zone substantially parallel to each other and in a direction substantially at right angles to the longitudinal direction of the row and have different lengths.

Due to this measure, which is known per se from Dutch Patent Application No. 7,705,729, a substantially uniform temperature distribution is obtained for each individual surface region of high dissipation. As a result, the stability is increased and further the range, within which such a power transistor can be operated, is considerably enlarged.

The thermal stability of a semiconductor device according to the invention can be increased still further when the device comprises a circuit composed of a number of parallel branches each comprising at least a control transistor and an output transistor, an output of each control transistor being electrically individually coupled to the input of an associated output transistor. In such a device, the stability is increased since each output transistor has the strongest thermal coupling with a control transistor different from that with which it is electrically coupled due to the fact that they are realized together in one surface region, and each output transistor preferably has the weakest thermal coupling with that control transistor with which it is electrically coupled.

This manner of theremal cross-coupling, which is known per se from U.S. Pat. No. 3.952,258, can be used, for example, in a circuit of the Darlington type in order to increase the thermal stability therein even further.

BRIEF DESCRIPTION OF THE DRAWING

The invention will now be described more fully with reference to several embodiments and the drawing, in which.

The Figures are schematic and are not drawn to scale, while in the various embodiments corresponding parts are generally designated by like reference numerals.

DESCRIPTION OF THE PREFERRED EMBODIMENTS

Figure 1:
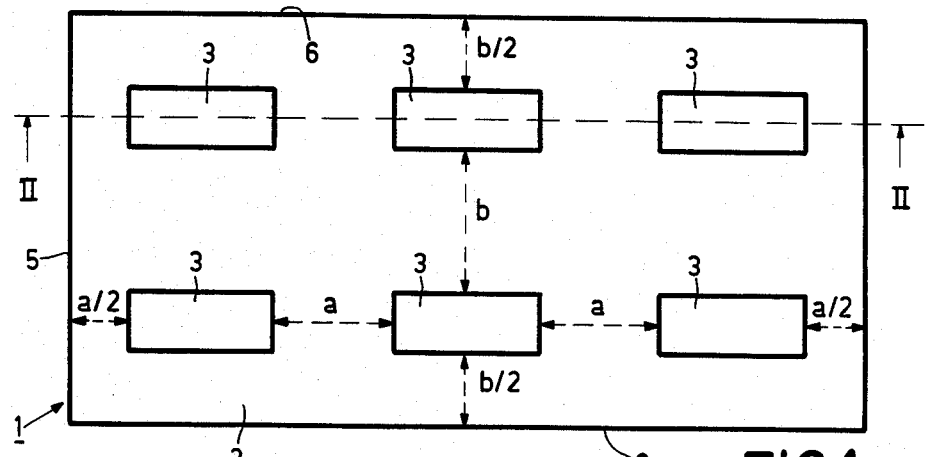
FIG. 1 shows diagrammatically in plan view a semiconductor device according to the invention.

The semiconductor device 1 of FIG. 1 comprises a semiconductor body 2 in which at a major surface has several subregions 3, which regions all occupy substantially the same surface area. In the subregions 3, electric circuits dissipating substantially the same quantity of energy are realized by means of semiconductor elements not shown further in FIG. 1.

Figure 2:
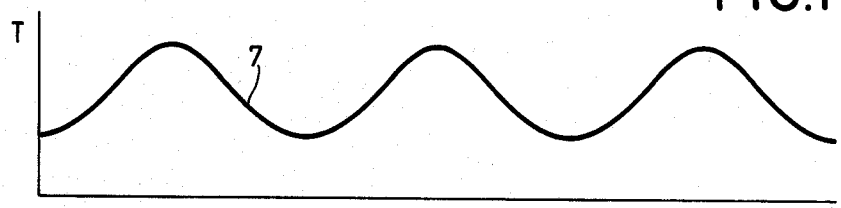
FIG. 2 shows diagrammatically the temperature variation during operation taken on the line II—II in FIG. 1.

With the same dissipation in each of the subelements, the contribution to the temperature increase in a subelement due to its own dissipation will be substantially the same. Viewed in a given direction, for example along the line II—II in FIG. 1, the contribution to the temperature increase due to adjacent elements will be smaller, but again the same for each of the subregions. In the article "Anomalous current distributions in power transistors" in Solid State Electronics, 1977, Vol. 20, pp. 635-640, the temperature distribution in one dimension is calculated for an ideal transistor structure having emitter fingers at equal distances. The temperature distribution is calculated for different values of thermal coupling between adjacent emitter fingers and more distant emitter fingers. This can yield a temperature variation as indicated by the line 7 in FIG. 2.

According to this theoretical consideration, a reflection principle is utilized, that is to say that the calculation given therein applies when the structure is assumed to have been obtained from a transistor having an infinite row of emitter fingers by choosing the two edges to lie halfway between two emitter fingers.

A similar theory applies to a semiconductor device according to the invention because in the direction of the line II—II the distance between the outer subregions 3 and the edges 5 is chosen to be equal to half the distance a between two subregions 3. This also applies in the direction at right angles to the line II—II. In this case, the distance between two subregions 3 is b and the distance between the outer subregions 3 and the edges 6 is b/2. It should be noted that the distances a/2 and b/2 may have tolerances considerably larger than the tolerances usual in semiconductor technology. In principle, a semiconductor device of the kind shown in FIG. 1 could occupy a considerably smaller surface area by choosing the distance between the edges of the regions 3 and the edges 5, 6 of the semiconductor body 2 to be a minimum. If these distances were smaller than a/2 and b/2, respectively, an asymmetrical temperature distribution would be obtained with unchanged distances a, b between the regions 3 due to the fact that an additional large temperature increase would occur in the subregions along the edges. For example in the case of a subdivided power transistor, this would lead to second breakdown in the outer subtransistors. Due to the invention, a better and more reliable product is obtained, resulting in a lower rejection percentage during operation at the expense of semiconductor surface area, which leads to a higher rejection percentage at the manufacturing stage. The advantages of a higher reliability in operation, however, certainly compensate for a low loss due to rejection at the manufacturing stage.

The distance between an outer subregion 3 and an edge 5, 6 of the semiconductor body is preferably equal to half the distance between two subregions. Due to the fact, however, that in practice tolerances for separation are taken into account, this distance will generally be slightly larger or smaller (on the order of 5 $\mu$m). This distance must not become much larger because in this case a non-uniform temperature distribution with higher temperatures (and hence the possibility of "second breakdown") at the center of the semiconductor body is obtained. It is possible, however, to utilize any additional space between the subregions and the edges for low-dissipating elements, such as, for example, connection tracks, alignment marks, etc.

Figure 3:
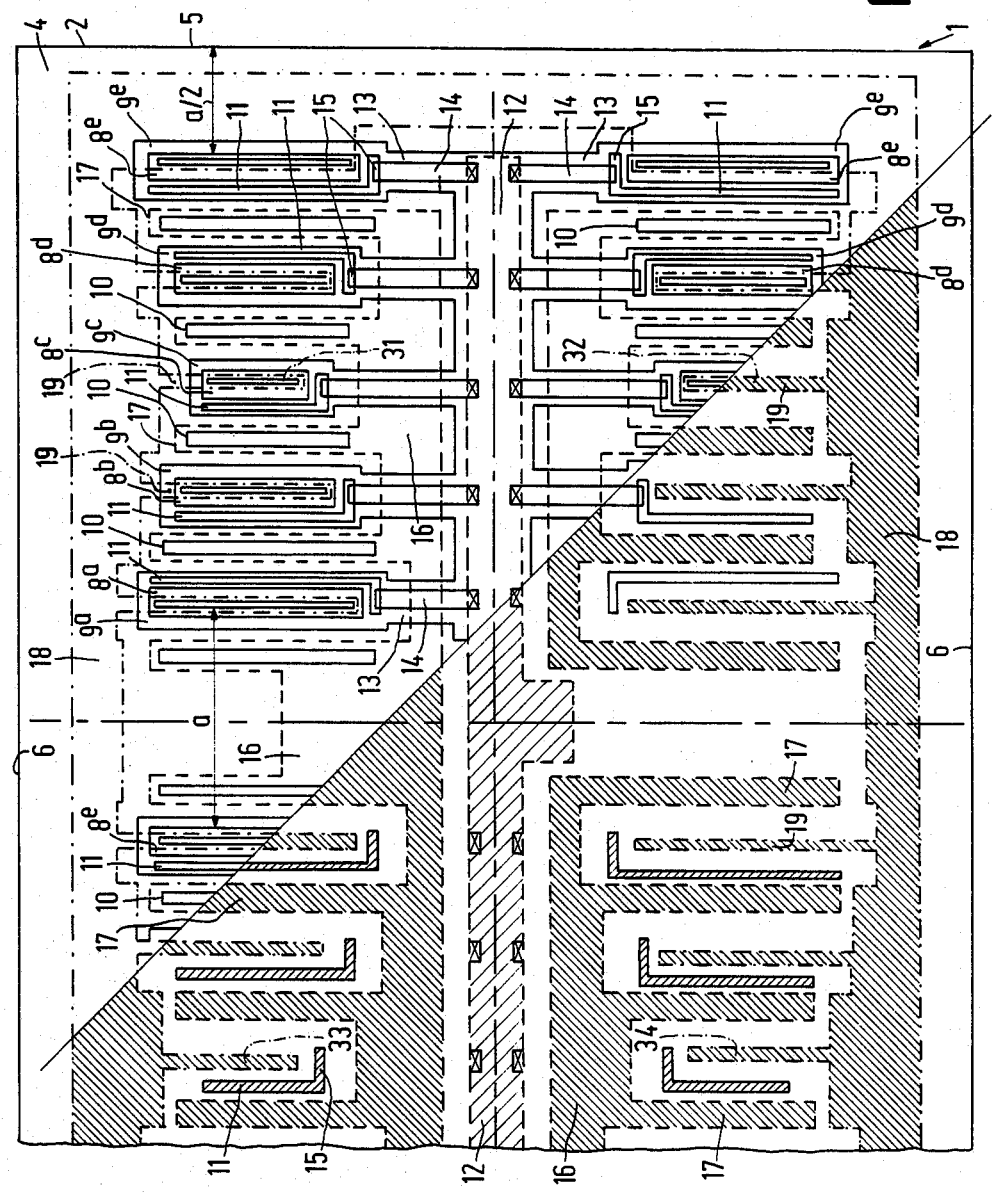
FIG. 3 shows diagrammatically in plan view a power transistor according to the invention.

FIG. 3 shows in plan view a power transistor which is composed of subtransistors and which may form part of a monolithic integrated circuit. This circuit, which is not shown further in the drawing, may consist, for example, of an amplifier device, in which the power transistor forms part of the output stage of the amplifier and other elements of the amplifier are realized, for example, between the subtransistors.

The device comprises a semiconductor body 2 of a form usual for conventional integrated circuits having a p-type silicon substrate not shown in the plan view of FIG. 3 and an n-type epitaxial silicon layer deposited thereon. The surface 4 of the body 2 is coated with an insulating passivation layer, mostly made of silicon oxide, which is provided with holes at areas at which the body 2 or parts thereof have to be contacted.

Each subtransistor comprises an n-type emitter 8 adjoining the surface 4 of the body 2, a p-type base 9 also adjoining the surface and a collector which in the present case also adjoins the surface. The collector comprises a part of the epitaxial layer and a low-ohmic buried n-type collector zone formed between the epitaxial layer and the substrate and not shown further in the drawing as well as n-type collector contact zones 10 extending from the surface into the buried layer.

In order to obtain an emitting surface of maximum size, the emitter is subdivided into a row of finger-shaped regions, which are designated hereinafter as emitter fingers. These emitter fingers, which for distinction are indicated with the suffixes a, b, c, d, e, extend parallel to each other and in a direction substantially at right angles to the row a, b, c, d, e in the base 9.

In order to obtain a low collector series resistance, the base 9 or at least the active or intrinsic part of the base is subdivided into a number of subzones. In order to be able to distinguish these subzones from each other, the reference numerals 9 of the individual subzones are provided in FIG. 3 from the lefthand side to the righthand side with the suffixes a, b, c, d, e. In each subzone 9a, 9b, 9c, 9d, 9e there is located only one emitter finger 8a, 8b, 8c, 8d, 8e.

The base is provided with a base contact having a plurality of base contact fingers 11 of a suitable metal, for example, aluminum, or of a combination of metals, applied to the base subzones 9 through usual contact windows. The base contact fingers 11 extend, viewed from above, substantially parallel to the emitter fingers over the surface 4 of the body 2 and are interconnected by a common base contact part 12 of the same metal or metals as the base contact fingers 11. The base contact fingers 11 can be conductively connected to the common contact 12 through a low-ohmic connection constituted by a so-called underpass comprising p-type zones 13 provided in the collector and adjoining the base subzones of the base fingers 91, 9b, 9c, 9d, 9e and n-type surface zones 14 located in the zones 13 and insulated by the latter from the n-type collector. The zones 13 and 14 can be formed during manufacture of the device simultaneously with the base 9 and the emitter 8, respectively. In the embodiment, each subzone of the base is therefore connected through a separate underpass 13, 14 to the common base contact 12. This configuration inter alia has the advantage that parasitic capacitances, especially between the base and the collector of the transistor, can be kept comparatively low. The pn junctions between the zones 13 and 14 are shortcircuited on the base contact side and in the present embodiment also on the other side, i.e. by the common base contact 12 and by the base contact fingers 11, which are provided at the area of this short-circuit with laterally projecting parts 15, as is shown in FIG. 3.

The collector is provided at the surface with a collector contact 16 having a number of collector contact fingers 17 which are contacted with the parts of the collector located between the base fingers 9a, 9b, 9c, 9d, 9e and, viewed on the surface 4, are interdigitated with the emitter fingers 8 and the base contact fingers 11. At the area of the contacts between the collector contact fingers 17 and the collector, there are provided, as usual, highly doped n-type contact zones 10.

The base and collector contacts (11, 12, 16, 17) are indicated in the plan view of FIG. 3 by full and broken lines, respectively, and are hatched in the lefthand lower half of FIG. 3. The areas at which the common base contact 12 is contacted with the underpass 13, 14, are indicated by the letter x in FIG. 3.

In the configuration shown, each emitter finger 8, viewed from above, is located between a base contact finger 11 and a collector contact finger 17. The emitter is provided with an emitter contact 18, which is indicated in FIG. 3 by dot-and-dash lines. The contact 18 comprises a number of emitter contact fingers 19 which are interdigitated with the base contact fingers 11 and the collector contact fingers 17. For a description in greater detail of such a transistor, which can be manufactured by conventional techniques, reference is invited to the aforementioned Dutch Patent Application No. 7,705,729.

The plan view of FIG. 3 shows four subtransistors 31, 32, 33, 34 of a larger transistor, only the surface areas of the subtransistors 31 and 32 being fully represented. If now the edges of the outer emitter fingers 8a, 8e are considered as edges of the dissipating regions, the dissipating subregions of the subtransistors 31 and 33 are located at a relative distance equal to a: this is the distance between the emitter finger 8e of the subtransistor 33 and the emitter finger 8a of the subtransistor 31. The aforementioned assumption is justified because in fact the major part of the dissipation of the transistor occurs at the area of the emitter fingers. According to the invention, the edge 5 of the semiconductor body 2 is located at a distance a/2 from the edge of the emitter finger 8e of the subtransistor 31. In this manner, a favorable temperature variation is obtained throughout the semiconductor body 2.

The part between the dissipating regions and between the edges 5, 6 and the disspating regions need not remain unemployed. In the present embodiment, the emitter contact 18 is located around the subtransistors 31 and 32, while on the surface between the subtransistors 31, 32, 33 and 34 there are provided extensions of the base contact 12 and the collector contact 16, which may serve, for example, as a bonding pad. If desired, other comparatively low-dissipating elements may also be realized here.

As appears from FIG. 3, the length of the emitter fingers 8 gradually decreases from the edges of a subtransistor towards the center. Thus, a more uniform dissipation is obtained for each of the subtransistors in the individual dissipating subregions within the subregion, which in turn leads to a favorable temperature variation throughout the semiconductor body.

In manufacture, several semiconductor bodies 2 are obtained from one semiconductor wafer by means of scribing and breaking along so-called scribing lanes. Due to scribing line tolerances, the edge 5 will generally not lie exactly at the distance a/2 from the emitter finger 8e. On the other hand, this distance must not deviate too much because then the idea on which the invention is based no longer applies. In practice, the relevant distance will therefore have a deviation on the order of at most 10 $\mu$m.

Figure 4:
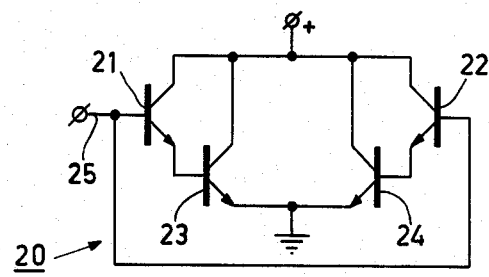
FIG. 4 shows a Darlington configuration.

FIG. 4 shows a Darlington circuit 20 composed of two sub-branches each comprising a Darlington circuit. The transistors 21 and 23 constitute a Darlington circuit, as do transistors 22 and 24. In this circuit, the collectors of the transistors 21, 22, 23 and 24 are all interconnected. The emitter of the transistor 21 is connected to the base of the transistor 23, while the emitter of the transistor 22 is likewise connected to the base of the transistor 24. The emitters of the transistors 23 and 24 are interconnected, while the bases of the transistors 21 and 22 are connected to an input terminal 25. The transistors are arranged so that the control transistor 21 has a strong thermal coupling with the output transistor 24 and the control transistor 22 has a strong thermal coupling with the output transistor 23 (this is the principle of thermal cross-coupling).

The dissipation of the two output transistors and of the two control transistors is in principle the same.

Figure 5:
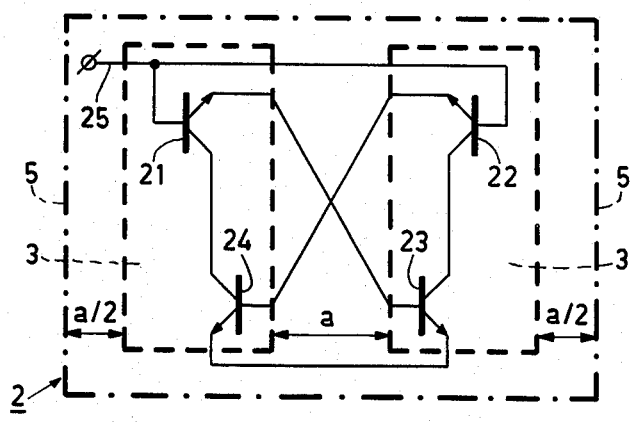
FIG. 5 shows the distribution of subelements of this Darlington configuration over the semiconductor surface in a semiconductor device according to the invention.

Therefore, in FIG. 5, which shows diagrammatically in plan view an embodiment of this circuit, the surface region 3 with the transistors 21 and 24 has substantially the same dissipation and surface area as the surface region 3 with the transistors 22 and 23. According to the invention, these regions 3 are located again at a relative distance a, while the distance between such a region 3 and the edge 5 of the semiconductor body 2 is again a/2. Thus, again a uniform temperature variation throughout the semiconductor body is obtained.

The thermal stability of the device is increased still further by the thermal cross-coupling described above. Let it be assumed that the collector current of the output transistor 23 increases. As a result, with a constant current throughout the device the collector current of the output transistor 24 decreases. Consequently, the dissipation in the output transistor 23 increases and that in the output transistor 24 decreases. Dut to the thermal couplings within the subregions 3, the temperature of the control transistor 22 increases and the temperature of the control transistor 21 decreases. The base-emitter voltage of the control transistor 22 consequently would decrease and the base-emitter voltage of the control transistor 21 would increase but for the fact that the series arrangement of the base-emitter junctions of the transistors 21 and 23 is connected in paralle with the series arrangement of the base-emitter junctions of the transistors 22 and 24. This parallel arrangement results in the temperature variation between the subregions 3 being compensated for by a current variation in a manner such that the collector current of the transistor 21 decreases and that of the transistor 22 increases. Thus, a negative feedback is active, which limits the increase of the collector current of the transistor 23. This negative feedback is also active as to the increase of the collector current of the transistor 24. Both parallel branches therefore retain a stable temperature and current distribution. For a more extensive description of this thermal cross-coupling, reference is invited to the aforementioned U.S. Pat. No. 3,952,258.

It goes without saying that the invention is not limited to the embodiments described above, but that within the scope of the invention various modifications are possible, For example, the relative distances between subregions in different rows need not be equal; for example, when the subregions comprise subtransistors of an output transistor of an electronic circuit, it is possible by choosing larger relative distances in one or more rows to make free a surface in which a part of comparatively low dissipation of the circuit can be realized. It is further possible to use methods of manufacturing the semiconductor device different from that described with reference to FIG. 3.

What is claimed is:

1. A semiconductor device comprising a semiconductor body having a major surface, a power transistor in said body and having an emitter of a first conductivity type adjoining said surface, a base of a second, opposite conductivity type, also adjoining said surface, and a collector of the first conductivity type adjoining the base, the emitter zone comprising a row of finger-shaped regions of the first conductivity type which extend in the base substantially parallel to each other in a direction at right angles to the longitudinal direction of the row, said row of finger-shaped regions comprising a plurality of sub-rows, each sub-row having a plurality of finger-shaped regions at substantially equal distances from each other, the distances between two adjacent sub-rows differing from the distance between the finger-shaped regions in a sub-row, said row being located between two parallel edges of the semiconductor body and along a line substantially perpendicular to said edges, and the distance between an edge and an adjacent sub-row being substantially equal to one-half the distance between two sub-rows.

2. A semiconductor device as claimed in claim 1, characterized in that the distance of the edge of the semiconductor body from the adjacent sub-row is at most 10 μm smaller or larger than half the distance between two adjacent sub-rows.

3. A semiconductor device as claimed in claim 1 or 2, characterized in that between the edge of the semiconductor body and the adjacent sub-row there are provided non-dissipating or low-dissipating elements.

4. A semiconductor device as claimed in claim 1 or 2, characterized in that the sub-rows comprise subtransistors of a power transistor having an emitter of a first conductivity type adjoining the surface, a base of the opposite conductivity type also adjoining the surface and a collector of the first conductivity type adjoining the base, the emitter zone being at least mainly constituted by a single row of finger-shaped regions of the first conductivity type, which extend substantially parallel to ech other, in a direction substantially parallel to said two parallel edges of the semiconductor body and have different lengths.

5. A semiconductor device as claimed in claim 4, characterized in that the finger-shaped regions adjacent the edge of each subtransistor are longest and the length of the finger-shaped regions progressively decreases from the edge of the subtransistor towards the center of the subtransistor.

6. A semiconductor device as claimed in claim 1 or 2, characterized in that the semiconductor device comprises a circuit composed of a number of parallel branches each comprising at least a control transistor and an output transistor, an output of the control transistor being electrically coupled to the input of the output transistor and each output transistor having the strongest thermal coupling with a control transistor other than that with which it is electrically coupled by providing the output transistor and the other control transistor in one said sub-row.

7. A semiconductor device as claimed in claim 6, characterized in that said control transistor and its electrically associated output transistor comprise a Darlington circuit.

* * * * *